(12) United States Patent
Amemiya

(10) Patent No.: US 6,387,574 B1
(45) Date of Patent: May 14, 2002

(54) SUBSTRATE FOR TRANSFER MASK AND METHOD FOR MANUFACTURING TRANSFER MASK BY USE OF SUBSTRATE

(75) Inventor: Isao Amemiya, Tokyo (JP)

(73) Assignee: Hoya Corporation (JP)

( * ) Notice: Subject to any disclaimer, the term of this patent is extended or adjusted under 35 U.S.C. 154(b) by 23 days.

(21) Appl. No.: 09/705,020

(22) Filed: Nov. 2, 2000

Related U.S. Application Data

(63) Continuation of application No. 09/206,932, filed on Dec. 7, 1998.

(51) Int. Cl.[7] .................................................. G03F 9/00
(52) U.S. Cl. ............................................................. 430/5
(58) Field of Search .................................. 430/5, 22, 322, 430/323, 324; 378/34, 35; 216/12

(56) References Cited

U.S. PATENT DOCUMENTS 5,800,949 A  9/1998  Edo et al.

OTHER PUBLICATIONS

Patent Abstracts of Japan re Japanese Laid–Open Publication No. 60081750 to NEC Corp. (May 9, 1985).

Patent Abstracts of Japan re Japanese Laid–Open Publication No. 05217876 to Matsushita Electric Ind. Co., Ltd. (Aug. 27, 1993).

*Primary Examiner*—S. Rosasco
(74) *Attorney, Agent, or Firm*—Cook, Alex, McFarron, Manzo, Cummings & Mehler, Ltd.

(57) ABSTRACT

A substrate for transfer masks and a method of manufacture for transfer masks are provided with which short manufacturing time, and shorter TAT can be realized. Alignment marks 5, a rear surface concavity 6, a dry etching stopper layer, and a slit 7 for cross-sectioning are formed in the substrate for transfer masks 10, padding 8 pads slit 7 for cross-sectioning and rear surface concavity 6, and a plate 11 is affixed with glue 9 in advance.

11 Claims, 1 Drawing Sheet

SUBSTRATE FOR TRANSFER MASK AND METHOD FOR MANUFACTURING TRANSFER MASK BY USE OF SUBSTRATE

This applicaition is a continuation of copending U.S. application Ser. No. 09/206,932 filed Dec. 7, 1998.

BACKGROUND OF THE INVENTION (i) Field of the Invention

The present invention is directed to a substrate for a transfer mask which can be used in the manufacture of the transfer mask with apertures as the transfer portion of the mask, and a method for manufacturing the transfer mask by the use of the substrate.

(ii) Description of the Related Art

Recently, a drawing method has been suggested called partial batch exposure (also called block exposure or cell projection exposure), in electron beam lithography, which performs pattern exposure using electron beams. This method has risen suddenly into the spotlight as the next generation LSI technology because it has a short drawing time, is suited for mass production, and makes ultrafine pattern drawing possible (see Japanese Patent Application Laid-Open No. 81750/1985, etc.).

In partial batch exposure, a transfer mask, in which each type of aperture (through-hole) has been formed (a stencil mask) in the shape of the pattern that should be exposed onto a Si thin film which is tens of microns thick, is used, and a designated section (block or cell) is partially exposed in one batch which an electron beam passing through these apertures. By repeating the exposure while selecting the shape of the apertures and linking together partial patterns, the desired pattern is drawn.

The partial batch exposure drawing method was invented to solve the problems in the direct drawing methods (so called one-stoke drawing methods) already in practical use that draw by scanning an exposure pattern with a narrow beam spot of an electron beam. Such problems include extremely long drawing time and low throughput. Even compared to direct drawing methods using variable rectangles rapid drawing is possible.

Transfer masks used for such things as this kind of partial batch exposure have conventionally been produced with various methods, but in general are produced by processing a silicon substrate (such as the silicon wafers on the market) because of its workability and strength.

Concretely, as shown in FIG. 1 for example, a transfer mask 30 is produced by etch processing the rear surface of a silicon substrate 31, forming a support frame 32 and a thin film 33 supported by support frame 32, and forming apertures 34 in the thin film 33. In general, a wet etching process using inorganic or organic alkali aqueous solution is used for the rear surface processing of the silicon substrate, and a dry etching process is used to form the apertures because high precision is required.

Further, because etch processing is performed on both the front and rear surfaces of the substrate, in general a substrate with an etching stopper layer, at a designated depth within the substrate, is used for processing stability. For example, such substrates as a SOI (silicon on insulator) substrate in which two silicon substrates of differing thickness are stuck together with a $SiO_2$ layer in between, a SIMOX (separation by implanted oxygen) substrate in which oxygen ions are driven in a high concentration onto a silicon substrate and an oxide film layer is formed by heat processing, or a multi-layered substrate formed with a boron rich layer at a designated depth on the silicon substrate as an etching stopper layer, are known as substrates with this kind of etching stopper layer.

When loaded on an electron beam drawing device for partial batch exposure, the size of the above transfer masks is between 5 mm–50 mm. This is small compared to the region of possible drawing of the drawing device used in the manufacture process of the transfer masks themselves. Therefore, recently large sized substrates have been used in the manufacture process of the transfer masks themselves, with the aim of improving manufacturing efficiency by patterning multiple transfer masks on a substrate at one time and processing them in one batch.

In this case, a dicing process is necessary in order to separate and remove each transfer mask from a single substrate.

However, the following problems exist in the conventional method of manufacture of transfer masks.

First, it is difficult to plan shorter TAT (turn around time). TAT stands for one cycle of operations, i.e. from designing the device pattern, trial production of a transfer mask, trial production of a LSI chip, changes to the design specifications, to production of the transfer mask. While stencil masks are now in the stage of practical use, the biggest problem is reducing the TAT. So-called hybrid lithography means that stencil masks are used in pattern transfers of 0.25 $\mu$m or less in super LSI, while conventional photomasks are used in other pattern transfers. If the manufacturing time of the stencil masks is longer than the manufacturing time of the photomasks, supply of the stencil masks becomes a source of delay in the whole process. When aiming for TAT reduction, it is absolutely necessary to make the manufacturing time of the stencil masks equivalent to the manufacturing time of the photomasks.

The manufacture of stencil masks is difficult compared to the manufacture of photomasks and such, because formation of a thin film and apertures is necessary. It is difficult to reduce the manufacturing time because there are many processes of manufacture, and there is a high rate of defect generation.

SUMMARY OF THE INVENTION

The present invention has been created with consideration given to the problems mentioned above, and aims to solve such conventional problems by providing a substrate for a transfer mask and a method for manufacturing a transfer mask with a short manufacturing time that will reduce TAT.

In order to achieve the above aims, the substrate for transfer masks of the present invention has apertures formed in the thin film supported by a supported frame, and has at least one alignment mark formed on the substrate in advance which is used for the purpose of processing a designated location on the substrate.

In a further invention the substrate for transfer masks of the present invention has apertures formed in the thin film supported by a supporting frame, has a rear surface concavity formed in advance on the rear surface of the substrate, and has a dry etching stopper layer on the rear surface of the thin film.

In another invention, in the substrate for transfer masks of the present invention, the rear surface concavity is filled with one or more selected from the group consisting of a resin, an adhesive, a paste and a low-melting metal;

a plate is affixed to the rear surface of the substrate for transfer masks with one or more selected from the group consisting of a resin, an adhesive, a paste and a low-melting metal;

the above plate is composed of one or more selected from the group consisting of silicon, carbon, a metal and a glass;

a dry etching mask layer is laid on the front surface of the substrate for transfer masks for the purpose of forming an aperture pattern in advance;

a slit for cutting is formed in advance in the rear surface side of the substrate for transfer masks for the purpose of dividing each transfer mark formed in a multiple arrangement on a single substrate;

the cutting slit is filled with one or more selected from the group consisting of a resin, an adhesive, a paste and a low-melting metal; or at least one alignment mark is build in advance onto the substrate used for the purpose of processing a designated location on the front surface of the substrate for transfer masks.

The method of manufacture of transfer masks of the present invention uses the substrate for transfer masks of the present invention.

With the present invention, the production time of transfer masks after receipt of the aperture pattern design can be easily reduced, and a reduction in TAT can be achieved by finishing processing of the rear surface concavity (back etching) in advance.

Further, by performing such difficult processes as forming a thin film in advance, one can avoid the generation of defects through these processes. When defects are generated, lower costs and improved efficiency can be promoted by not performing aperture formation.

In addition, because the substrate for transfer masks of the present invention is structurally stable, defects such as damage will not arise in the manufacture process of the transfer masks, and the transfer masks can be manufactured without many steps.

DETAILED DESCRIPTION OF THE PREFERRED EMBODIMENTS

Figure 1:
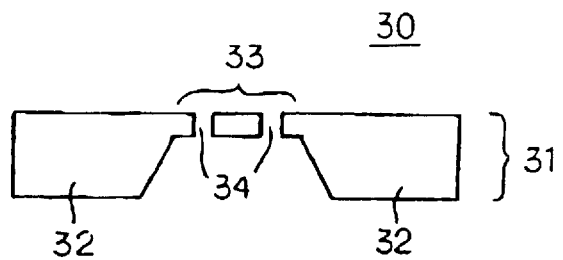
FIG. 1 is a cross-sectional view describing a transfer mask.

The following is a detailed description of the present invention.

The first invention will now be explained.

The substrate for transfer masks of the first invention has at least one alignment mark on the substrate in advance which is used for the purpose of performing processing on a designated location on the substrate.

By providing alignment marks on the substrate in advance, the process of alignment mark formation can be omitted and the TAT can be shortened by that amount.

Here, alignment marks are used as standard points for alignment for performing such things as etch processing a designated location on the substrate when processing the front and rear surfaces of the substrate for transfer masks to manufacture transfer masks. Concretely, for example, alignment marks are used for exposing the resist layer and the etching mask layer using an electronic beam drawing device or stepper, and to precisely determine the exposure location when patterning these layers.

Alignment marks may be formed on the substrate for transfer masks, and the location of the formation, shape, form and number are not particularly restricted. When manufacturing multiple transfer masks in one batch on a single substrate, it is preferable to make the formation location, shape, form and number suitable to one another.

Alignment marks may be formed directly onto the front surface of the substrate for transfer masks, such as a silicon substrate, by etching, or they may be formed by etching on the etching mask layer formed on the front and rear surfaces of the substrate for the purpose of processing the substrate for transfer masks, using such processes as either deposition or laser processing.

The location of the formation of the alignment marks is not particularly restricted. Usually one avoids the thin film (corresponding to the area for aperture formation), and forms the marks on locations or the transfer mask outside of thin film. Alternatively when manufacturing multiple transfer masks in one batch on a single substrate, the marks can be formed in the region outside the area of each transfer mask formation.

In this case, the alignment marks are formed in a location for which the relationship of the locations of the area of formation of the thin film and the range of formation of the rear surface concavity is made clear in the placement design (layout). For example, this can be at the intersections of the substrate periphery and the neighboring transfer masks on all four sides.

The alignment marks may be formed either on the front or rear surface of the substrate, because alignment can be done in either side using a normal mirror. Usually, the marks are formed on the front surface of the substrate (the surface where the aperture pattern is formed).

The second invention will now be explained.

The substrate for transfer masks of the second invention, has rear surface concavity (window) formed in the rear surface of the substrate in advance, as well as a dry etching stopper layer in the rear surface of the thin film.

By forming a rear surface concavity in advance in this way (finishing the processing of the rear surface concavity in advance), the manufacturing time of the transfer mask itself can be decreased. Further, by decreasing the manufacturing time of the transfer mask itself, the amount of time spent in the whole chain of operations (TAT), from device pattern design, trial production of a transfer mask, trial production of an LSI chip, design specifications changes, to production of the transfer mask, can be greatly reduced. Further, many defects arise, such as damage, during processing of the rear surface concavity regardless of the type of aperture processing because of the exemplary weak, delicate thin film is formed intensely. However, by finishing the processing of the rear surface concavity beforehand, one can avoid the generation of defects that accompanies the processing of the rear surface concavity.

Further, with the second invention, stabilization of the manufacture process of the transfer mask can be promoted with the dry etching stopper layer in the rear surface thin film. In other words, etching control during aperture processing and rear surface concavity processing is made easy with this dry etching stopper layer. It also protects the apertures during the process of removing padding from the rear surface concavity.

The dry etching stopper layer may be formed in the middle layer of the substrate in advance (a SOI plate or SIMOX plate), or it may be formed afterward on the rear surface of the thin film after processing of the rear surface concavity. If formed afterward, the dry etching stopper layer may double as padding material for the rear side concavity. $SiO_2$, SOG (spin on glass), or SiN and such may be used as the dry etching stopper layer.

Alkali aqueous solutions such as KOH, NaOH, or alkali solutions such as alkali aqueous solutions containing alcohol, and organic alkali, may be used as the etching solution for the rear surface of the substrate when using a silicon substrate.

It is best to select a suitable etching temperature corresponding to the materials.

Deeping and other such methods are suggested as the etching method.

Inorganic layers such as $SiO_2$, SiC, $Si_3N_4$, sialon (a composite mixture of Si and Al), or SiON can be used as the wet etching mask layer for protecting areas other than the portion to be etched during rear surface processing (for example the front surface of the substrate or the support frame on the rear surface of the substrate). Metallic simple substances such as tungsten, zirconium, nickel, chromium, alloy containing one or more of these materials, or metallic compounds containing these metals or alloys and at least one or more of the elements oxygen, nitrogen, or carbon, can also be used as the wet etching mask layer.

Thin film formation methods such as spattering, vacuum deposition, heat oxidation, CVD (chemical vapor deposition), or methods that use SOG (spin on glass), photosensitive glass, or photosensitive SOG, are suggested as formation methods for a $SiO_2$ inorganic wet etching mask layer. Thin film formation methods such as spattering, vacuum deposition, or CVD are suggested as formation methods for a metallic wet etching mask layer.

In the substrate for transfer masks of the second invention, the rear surface concavity (window) can be filled with a resin, a glue, a paste, or a low melting point metallic material.

By padding the rear surface concavity with padding in this way, one prevents damage during processing carried out after processing the rear surface concavity. This also prevents bending (warping) of the thin film through pressure differences resulting in the front surface of the substrate when forming the aperture pattern in the thin film by vacuum chucking or dry etching in resist processing of the front surface of the substrate. Further, one can prevent also vacuum heat insulation of the concavity of the rear surface of the substrate and increase heat conductivity, form clean apertures in a straight line in the silicon thin film, and produce transfer masks with good capabilities for practical use.

A material that does not easily cause stress on the thin film (with a small contraction shrinkage rate and coefficient of linear expansion), is easy to pad (fill) with and to remove, has excellent heat conductivity, and electroconductivity, and is very removable (washable) is preferable as the padding. Resins such as an acrylic resin or vinyl resin, a photohardening type or room temperature hardening type glue, pastes such as thermoplastic paste or silver paste, or low melting point metallic materials are suggested as such materials. Metals such as Sn, In, Zn, Sb, Pb, Bi, or Ag, or a low melting point metal such as an alloy containing these metals, or a high polymer material with good heat conductivity are suggested as materials with good heat conductivity.

One can perform a de-gassing process for these padding materials by baking in order to prevent the generation of gas at the time of electron beam exposure. Also, a metallic filler can be added to the padding material in order to grant heat conductivity or electroconductivity.

It is a necessary characteristic of the padding material used as padding that it does not generate gas in a vacuum (under reduced pressure) and similarly, that it does not generate a gas under raised temperatures of 200° C. If it does generate a gas, it will have a bad effect during formation of the aperture pattern (formation of the resist, dry etching) and will become the root of device contamination, lowering the stability of the process.

Filling methods such as filling (padding) the rear surface concavity of the substrate with resin or glue (padding), filling the rear surface concavity of the substrate with a low melting point metal by pouring a low melting point metal in a melted state into the rear surface concavity of the substrate in its melted state, filling by pouring it into the rear surface concavity in an organic metal state (colloid or gel state) and heating processing, or filling by pouring a substance in which metallic superfine grains have been dispersed within a binder (such as silver paste) into the rear surface conductivity of the substrate and de-binder processing are suggested as filling methods.

It is preferable to pad the rear surface concavity with padding so that the padding forms a single plane with the rear surface of the substrate.

The melting of removing the padded low melting point metal is not particularly limited, as it can be easily removed by using a solution that will not corrode the silicon substrate such as heat concentrated sulfuric acid or an alkali aqueous solution.

A plate may be affixed to the rear surface side of the substrate for transfer masks of the second invention with one or more of either resin, paste, or glue.

This plate is for the purpose of avoiding such situations as the substrate tilting on the holder of these devices (a stage or chuck), or being unable to secure through adsorption due to a gap in the rear plane of the substrate due to buckling, which easily occurs on the surface of the padding material due to the shrinkage and tension when performing exposure or dry etching for the purpose of processing the thin film, even when padded so that the padding material forms a single plane with the rear surface in the rear surface concavity. By securing the substrate for transfer masks on the plane by affixing a plane to the rear surface side of the substrate for transfer masks, damages resulting during later processing and handling can be more completely prevented.

The same material as the padding can be used to affix the plate. In this case, the same material can double as padding and as a fixing agent for the plate. Alternatively a different material can be used. A lamination construction comprising the same or a different type of material can also be used as a fixing agent for the plate.

A material with superior heat conductivity smoothness, processing precision, and removability in the case that the plate will be removed by melting is preferable for the plate. One or more of the following materials are suggested for the plate material: silicon, carbon, metal, or glass.

A dry etching mask layer may be laid down in advance on the front surface of the substrate for transfer masks of the first and second invention for formation of the aperture pattern.

Finishing all possible processing before formation of the aperture pattern promotes a reduction in TAT. In other words, compared to performing all of these procedures after receiving the aperture pattern design, if done in advance, transfer masks can be produced after only forming the aperture pattern and removing the unnecessary layers. Thus, the production time of the transfer masks is reduced, and TAT is reduced by that amount.

From the same standpoint, one may also lay down a resist layer on the dry etching mask layer in advance, if necessary.

An inorganic layer such as silicon oxide ($SiO_2$), SiC, $Si_3N_4$, sialon (a composite mixture of Si and Al) or SiON, a metallic layer such as a metal such as titanium, chromium, tungsten, zirconium, or nickel, an alloy containing these metals, or a metallic compound of these metals and/or alloys and oxygen, nitrogen, or carbon, or an organic layer such as a resist, or photosensitive film, are suggested as a dry etching mask layer.

Thin film formation methods such as spattering vacuum deposition, heat oxidation, CVD, or a method using SOG (spin on glass), photosensitive glass, or photosensitive SOG are suggested as the formation method for an inorganic dry etching mask layer such as a $SiO_2$ layer. Thin film formation methods such as spattering, vacuum deposition, or CVD are suggested as the formation method for a metallic dry etching mask layer.

It is preferable to form a slit for cutting for the purposes of separating each transfer mask formed in a multiple arrangement on a single substrate on the rear surface side and/or the rear surface side of the substrate for transfer masks, if necessary for the substrate for transfer masks of the first and second inventions.

This will promote a reduction in TAT by finishing these processes in advance in the case that formation of a slit for cutting in order to separate each transfer mask formed in a multiple arrangement on a single substrate is necessary.

It is preferable to form the slit for cutting on the rear surface side of the substrate for transfer masks. This is because the slit for cutting can be formed at the same time as rear surface concavity processing and also so cutting can be done easily and with stability. In other words, because the processing of the groove for separating transfer masks is performed in only one direction, problems such as position slippage, that arise when groove processing is performed from both the front and rear surfaces, will not arise at all. Further, structurally weak portions resulting from position slippage will not be formed anywhere in the transfer masks. Also, transfer masks having highly precise outside diameter dimensions and peripheral walls can be manufactured by a simple process.

The shape of the slit for cutting is not particularly restricted, but by making it in a shallow V shape groove, breaking during processing after slit formation can be avoided.

In the present invention, the process of the slit for cutting formation in the rear surface side of the substrate by wet etching and the process of the support frame and thin film formation by forming a concavity in the rear surface of the transfer mask by wet etching, can be carried out at the same time and with the same etching solution. In this way, an increase in manufacturing processes can be avoided. It is also possible to perform these processes separately, but when forming a wet etching mask layer on the rear surface of the substrate and patterning it, manufacturing efficiency is better if the slit for cutting and the pattern for processing the rear surface concavity are formed using the same etching solution at the same time.

When dividing each transfer mask using the slit for cutting formed in the rear surface of the substrate for transfer masks, a restraint film can be built onto the rear surface side of the substrate for transfer masks in order to prevent dispersion of the transfer masks and damage caused by that dispersion. A resin containing one or more fluoride series, ethylene series, propylene series, butadiene series, silicon series, or styrene series resin, a rubber hardened with one of these resins, a photosensitive resin, or an inorganic membrane forming material (such as SOG, SiN, etc.) are suggested as examples of a material for this kind of restraining film.

With the present invention, cutting can be performed with the rear surface concavity padded with padding material. One may also use a mechanical cutting separation method with a dicing saw or a laser beam without forming a slit for cutting in the present invention, because damage to the transfer masks can be avoided by padding the rear surface and affixing a plate.

Next, the method of manufacture of transfer masks of the present invention will be explained.

With the method of manufacture of transfer masks of the present invention, transfer masks are manufactured using the substrate for transfer masks of the present invention described above.

In order to pattern the dry etching mask layer in the substrate for transfer masks of the present invention described above with the same shape as the desired aperture shape, one can for example apply a resist on the etching mask layer, form a resist pattern by exposure and development, and perform etching of the etching mask layer with this resist pattern as mask.

However, the resist process can be omitted if a photosensitive glass is applied to a silicon substrate, and, it is used as the etching mask material.

High precision processing by dry etching of the aperture pattern is preferable for aperture processing on the front surface side of the substrate, considering aperture processing precision. However one can also use such methods as formation of the aperture pattern portion by discharge processing (Japanese Patent Application Laid-Open No. 217876/1993).

The etching gas used in dry etching is not particularly restricted, but such gases as fluorocarbons ($CF_4$, $C_2F_6$, $CHF_3$, etc.) for example, are suggested as etching gases for a dry etching mask layer (such as $SiO_2$), while HBr gas, $Cl_2/O_2$ mixture gas, $SiCl_4/N_2$ mixture gas and such are suggested as etching gases for a silicon substrate.

Unnecessary layers that have served their purpose, are eliminated at a suitable stage during the manufacturing process.

With the method of the present invention, a metallic layer can be formed on the front surface of the transfer masks manufactured as above.

This is because for a transfer mask composed of a simple silicon substance, in an unaltered condition the silicon thin film in which apertures are formed has poor durability against the electron beam. By forming a metallic layer on the silicon thin film such as tantalum, tungsten, molybdenum, gold, platinum, silver, iridium, or palladium the durability of the mask during electron beam irradiation is improved. Further, these metals are good conductors, and contribute to the prevention of beam slippage due to electrification (charge up) and heat warping of the mask due to heat generation because they have excellent electron conductivity and heat conductivity. These metals can also be used to construct a very thin silicon thin film because they are have excellent electron beam shielding capabilities and they are used as energy absorption bodies. As a result, the precision of the apertures is improved, and the influence on the electron beam from the aperture side walls is decreased.

Such methods of thin film formation as spattering, vacuum deposition, ion beam vacuum deposition, CVD, ion plating, electroplating, and plating are suggested as methods for formation of the metallic layer.

Further, by forming a metallic layer on the substrate for transfer masks of the present invention beforehand, the apertures may also be formed in the metallic layer and in the silicon thin film successively by dry etching, with the method of the present invention.

When apertures are formed by successively dry etching the metallic layer and the silicon thin film in this way, aperture formation including the metallic layer can be performed in an amount of time made shorter by the single process of successive dry etching, and highly precise apertures can be formed easily as well.

Fluorocarbon gases ($SF_6/O_2$ mixture gas, $SF_6/Cl_2$ mixture gas, $CF_4/O_2$ mixture gas, $CBrF_3$ gas, etc.) are suggested as dry etching gas of the metallic electroconductive layer. One can also successively etch the metallic electroconductive layer and the silicon substrate with the same etching gas by using a gas such as $SF_6$.

Si, Mo, Al, Au, or Cu can be used as the substrate material. However, from the standpoint of chemicals resistance, processing condition, and dimensional precision such substrates as a silicon substrate, a SOI substrate, or a SIMOX (separation by implanted oxygen) substrate in which an oxide film is formed by implanting oxygen ions on a silicon substrate in high concentration and heat processing, are preferable. The electron conductivity of the silicon substrate can be improved if a silicon substrate doped with phosphorous or boron is used.

EMBODIMENTS

The present invention is described in further detail in the embodiments below.

Embodiment 1

Production of the substrate for transfer masks

Figure 2:
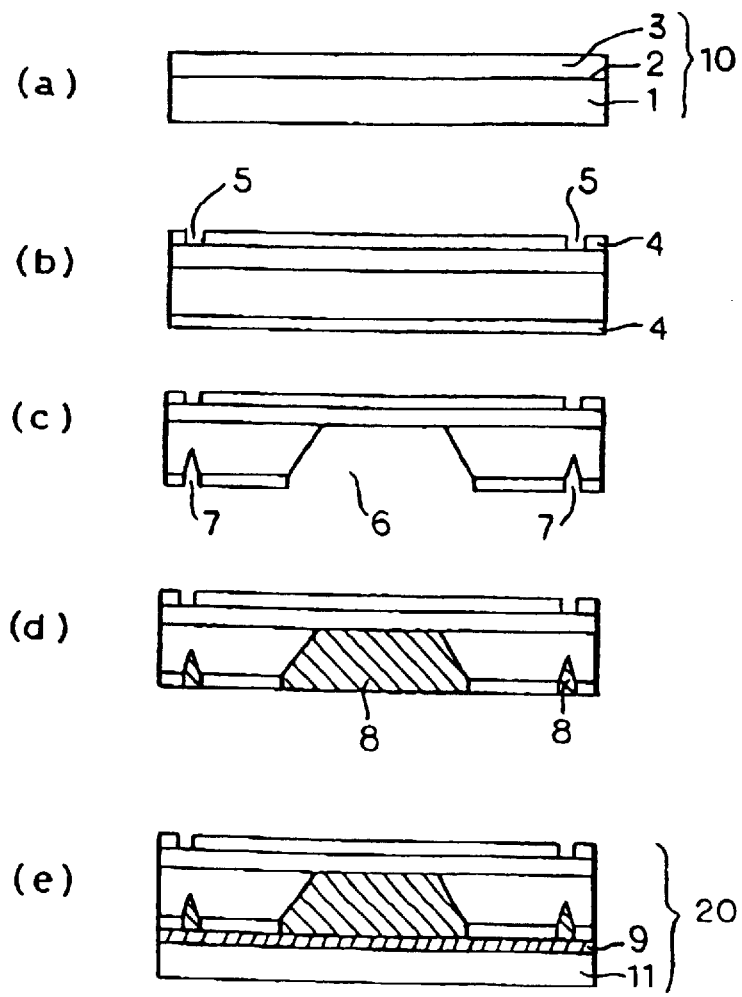
FIG. 2 is a partial cross-sectional view showing one example of the manufacturing procedure of the substrate for transfer masks of the present invention.

FIG. 2 is a cross-sectional view showing one example of the production procedure of the substrate for transfer masks of the present invention.

As shown in FIG. 2, after formation by CVD of a 1 μm thick $SiO_2$ layer 4 on all surfaces of the substrate (front, back, and sides) using a multiple layer SOI substrate 10 (FIG. 2(a)) having a Si layer 1 (20 μm), a $SiO_2$ layer (2 μm), and a Si layer 3 (500 μm), alignment marks 5 are formed in two designated locations on the $SiO_2$ layer of the front surface side by etching (FIG. 2(b)). The $SiO_2$ layer of the rear surface side of the substrate is formed at the same time as the $SiO_2$ layer of the front surface side of the substrate in order to prevent scratching during the processing.

Next, after a $Si_3N_4$ layer (not illustrated) is formed on all surfaces of the SOI substrate by CVD, designated patterning is carried out on the $Si_3N_4$ layer and the $SiO_2$ layer in a designated location on the rear surface side of the substrate positioned by the front surface side alignment marks 5. Slit 7 for cutting and the rear surface concavity 6 are formed in designated positions on the rear surface of the substrate by wet etching using KOH with this patterned $Si_3N_4$ layer as a mask (FIG. 2 (c)). In order to obtain multiple transfer masks simulataneously, multiple slits 7 for cutting and rear surface concavities 6 are likewise formed.

Next, after washing and drying the substrate obtained as above, the rear surface concavity 6 and the slit for cutting 7 are filled with a silver series low temperature hardening paste as a padding material 8 in such a way so that there are no bubbles. After drying at room temperature, the hardening process is performed at a maximum temperature of 200° C. (FIG. 2(d)).

Finally, a quartz substrate 11 is affixed to the rear surface side of the substrate obtained as above with a photohardening glue 9 (FIG. 2(e)). A mercury lamp is used to harden the photohardening glue 9, and it is baked in a vacuum at 200° C. as a de-gassing process.

Through the above process, one obtains the substrate for transfer masks with one portion of the processing finished.

Production of the transfer masks

A resist layer is formed on the upper surface side of the substrate for transfer masks obtained as above, and it is patterned by electron beam exposure and dry etching methods.

After patterning the dry etching mask layer 4 ($SiO_2$ layer) by dry etching with a patterned resist layer as mask and removing the resist, an aperture pattern is formed in the thin film of the substrate for transfer masks by dry etching with this patterned dry etching mask layer as a mask.

Next, after removing the now unnecessary $SiO_2$ layer, padding material, and quartz substrate, a metallic layer is formed on both surfaces of the substrate for transfer masks.

Finally, the transfer masks are obtained by cutting separate each transfer mask using the slit for cutting as the origin.

The substrate for transfer masks of the present invention is structurally stable, and as a result, defects such as damage during the production process of the transfer masks do not arise. The stability of the entire manufacturing process of the transfer masks has been greatly improved.

Further, by using the substrate for transfer masks of the present invention in the above manner, the production time of the transfer masks after receipt of the aperture pattern design was easily reduced. Conventionally, after receiving the aperture pattern design, three weeks were necessary to produce a transfer mask, performing the whole process. By using the substrate for transfer masks of the present invention, we have been able to reduce TAT, and transfer masks can be produced in about 3 days.

Also, TAT can be reduced even further because we can produce multiple transfer masks with different aperture pattern designs in one batch.

Embodiment 2

A slit for cutting is not formed, and one transfer mask is formed from the substrate for transfer masks. In all other respects, transfer masks are obtained in the same way as in embodiment 1.

Embodiment 3

A SOI substrate is not used, and after forming a rear surface concavity on the rear surface of the substrate, SOG is applied to the rear surface side of the thin film and a dry etching stopper layer is formed. In all other respects, transfer masks are obtained in the same way as in embodiment 1.

In this case, manufacturing costs are lower compared to a case where a SOI substrate is used, because bare silicon is used.

Embodiment 4

A metallic layer is formed on the front surface of the substrate in embodiments 1–3. and an aperture portion including the metallic layer is formed by consecutive dry etching. In all other respects, transfer masks are manufactured in the same way as in embodiments 1–3.

The transfer masks obtained have much more highly precise apertures in comparison to coating with a metallic layer after aperture formation.

Above, we have explained the present invention giving preferred embodiments. However the present invention is not limited to the above embodiments.

For example, one may also use the same material for the padding and glue and integrate these steps.

Further, the material and formation method of the etching mask layer is not particularly restricted, and the etching mask layer on the rear surface side and the front surface side may be formed separately.

Further, by forming the thin film on the front surface side, one may form the alignment marks on the front surface side marked with designated locations.

Further, for the transfer masks of the present invention, a mask for ion beam exposure or X-ray exposure may also be used instead of an electron beam exposure mask.

What is claimed is:

1. A method for manufacturing a transfer mask which comprises a thin film having an aperture pattern therein and a supporting frame to support said thin film;

said method being included in a process for manufacturing a semiconductor device; said process comprising a first process for designing a device pattern, a second process for manufacturing a plurality of masks including said transfer mask in accordance with said device pattern, and a third process for transferring said device pattern from said masks onto a substrate to be transferred thereon, wherein at least a process for forming an alignment mark on said supporting frame of a supporting substrate and a process for achieving a structure having a rear groove beneath said thin film in such a manner that a rear side of said supporting substrate is partially removed at a location which is aligned with said alignment mark are performed prior to obtaining a design information of said device pattern, and a process for forming said aperture pattern is performed in accordance with said device pattern at said location after obtaining said design information.

2. The method according to claim 1, wherein a dry etching stopper layer is formed on a rear surface of said thin film.

3. The method according to claim 1, wherein said method further comprises, prior to obtaining said design information, a process for filling said rear groove with one or more materials selected from a group consisting of a resin, an adhesive, a paste and a low-melting metal.

4. The method according to claim 1, wherein said method further comprises, prior to obtaining said design information, a process for filling said rear groove with one or more materials selected from a group consisting of a resin, an adhesive, a paste and a low-melting metal, and a process for affixing said rear groove with plain plate.

5. The method according to claim 4, wherein said plain plate is made from one or more materials selected from a group consisting of a silicon, a carbon, a metal and a glass.

6. The method according to claim 1, wherein said method further comprises, prior to obtaining said design information, a process for depositing a dry etching mask layer on a front surface of said supporting substrate.

7. The method according to claim 1, wherein said method further comprises a process for forming a plurality of cutting slits at a rear side of said supporting substrate to separate said transfer mask into a plurality of transfer sub-masks prior to obtaining said design information, and a process for separating said transfer mask into said plurality of transfer sub-masks after forming said aperture pattern.

8. A transfer mask manufactured in accordance with a method as set forth in claim 1.

9. A method for manufacturing a semiconductor device which comprises a process for transferring a pattern by employing a transfer mask as set forth in claim 8.

10. A method for manufacturing a transfer mask which comprises a thin film having an aperture pattern therein and a supporting frame to support said thin film;

said method being included in a process for manufacturing a semiconductor device; said process comprising a first process designing a device pattern, a second process for manufacturing a plurality of masks including said transfer mask in accordance with said device pattern, and a third process for transferring said device pattern from said masks onto a substrate to be transferred thereon, wherein said method comprises a process for preparing a substrate for transfer mask having an alignment mark on said frame of a supporting substrate and a rear groove beneath said thin film constituted in such a manner that a rear side of said supporting substrate is partially removed prior to obtaining a design information of said device pattern at a location which is aligned with said alignment mark.

11. A substrate for transfer mask utilized for a method set forth in claim 10, said substrate comprising:

an alignment mark formed on the supporting frame of the supporting substrate; and a rear groove beneath the thin film achieved in such a manner that a rear side of the supporting substrate is partially removed at a location which is aligned with said alignment mark.

* * * * *